United States Patent [19]

Cannizzaro et al.

[11] Patent Number: 5,433,238
[45] Date of Patent: Jul. 18, 1995

[54] PUMPING SYSTEM FOR EVACUATING REACTOR CHAMBERS

[75] Inventors: Stephen Cannizzaro, Boise, Id.; John Cain, Schertz, Tex.; Miguel Delgado, San Antonio, Tex.; Ramiro Solis, San Antonio, Tex.

[73] Assignee: VLSI Technology, Inc., San Jose, Calif.

[21] Appl. No.: 300,935

[22] Filed: Sep. 6, 1994

Related U.S. Application Data

[63] Continuation of Ser. No. 993,210, Dec. 18, 1992, abandoned.

[51] Int. Cl.$^6$ .............................................. B65B 31/04
[52] U.S. Cl. ...................................... 137/14; 137/566; 137/606; 137/861; 141/8; 141/65
[58] Field of Search ............... 137/566, 606, 607, 861, 137/14; 141/7, 8, 65

[56] References Cited

U.S. PATENT DOCUMENTS

| | | | |
|---|---|---|---|
| 2,757,840 | 8/1956 | Weissenberg et al. | 141/8 |
| 4,172,477 | 10/1979 | Reich | 141/8 |
| 4,181,161 | 1/1980 | Kraus | 141/8 X |
| 5,031,674 | 7/1991 | Mack | 141/8 X |
| 5,244,019 | 9/1993 | Derby | 141/65 |

*Primary Examiner*—John Rivell
*Attorney, Agent, or Firm*—Burns, Doane, Swecker & Mathis

[57] ABSTRACT

A system for evacuating a reactor chamber includes a main evacuation line connected at one end thereof to the reactor chamber and at another end thereof to a means for creating a partial vacuum. A valve in the main evacuation line divides the line into a chamber side and a vacuum side. A second line is connected at one end to the vacuum side of the main evacuation line and at another end to a fluid supply source. As the valve in the main evacuation line is opened, fluid is supplied through the second line to the main evacuation line to prevent rapid, turbulence-inducing pressure drops in the reactor chamber.

17 Claims, 2 Drawing Sheets

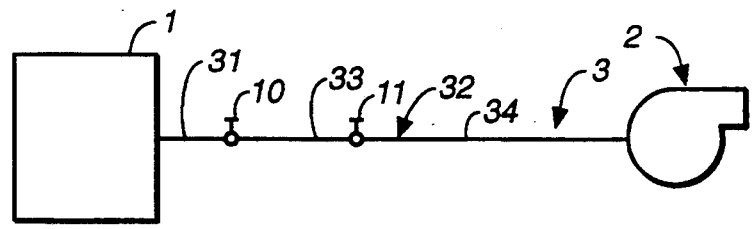
FIG._1
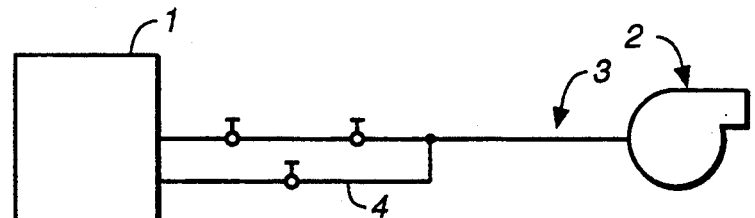
FIG._2
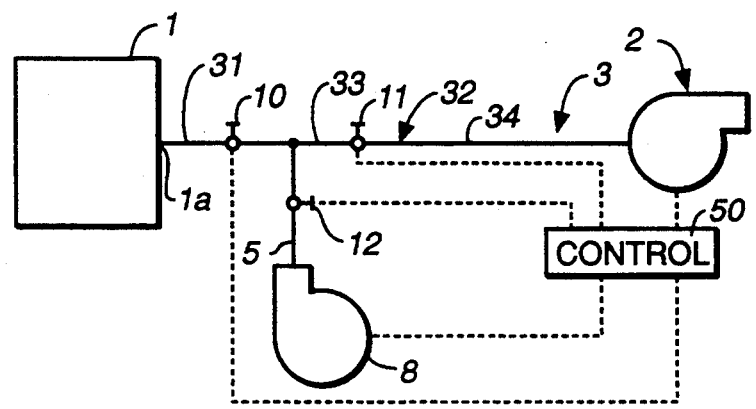
FIG._3
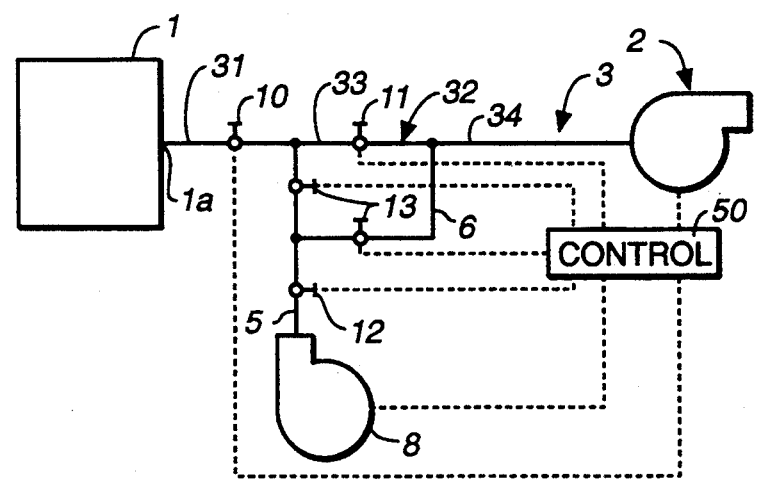
FIG._4

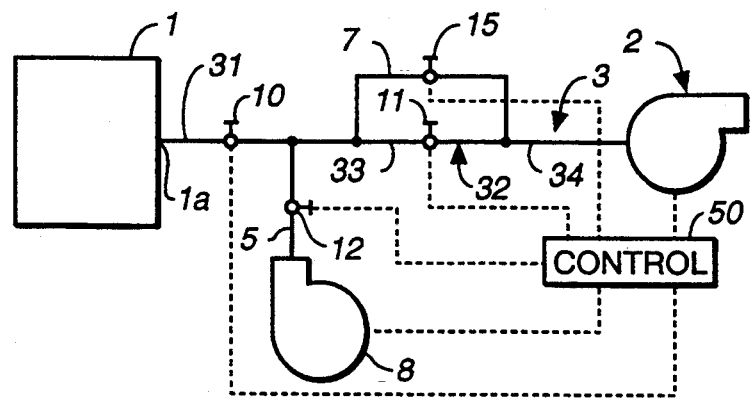
FIG._5
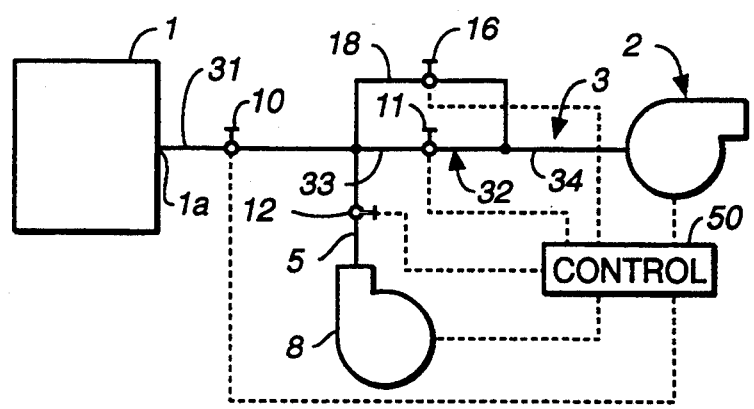
FIG._6
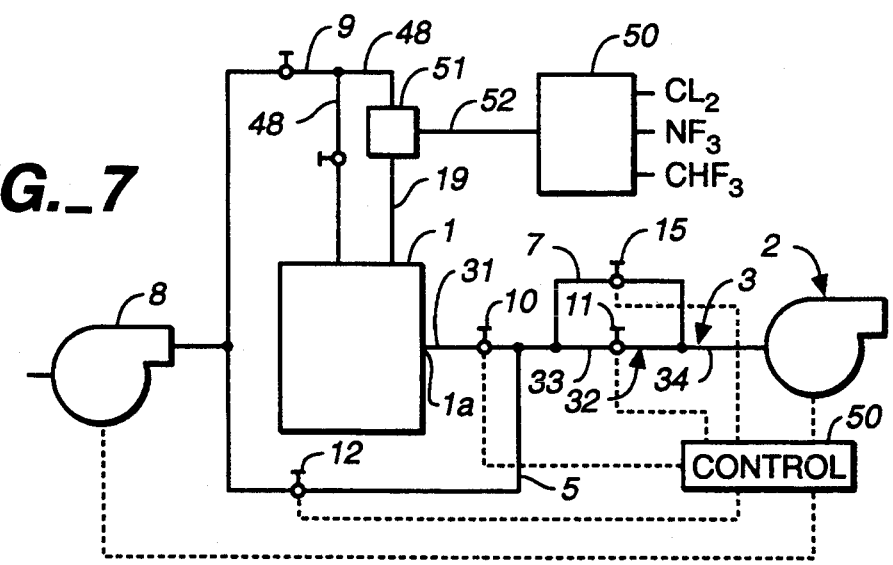
FIG._7

PUMPING SYSTEM FOR EVACUATING REACTOR CHAMBERS

This application is a continuation of application Ser. No. 07/993,210, filed Dec. 18, 1992 now abandoned.

BACKGROUND OF THE INVENTION

1. Field of the Invention

The present invention generally relates to systems for manufacturing semiconductor integrated circuits and, more particularly, to pumping systems for evacuating reactor chambers that are used in the manufacture of semiconductor integrated circuits.

2. State of the Art

In the manufacture of semiconductor integrated circuits, it is typical to employ chambers from which air has been evacuated. During the evacuation of such reactor chambers, significant turbulent effects can be caused. When the reactor chamber is used in the manufacture of semiconductor integrated circuits, turbulence is highly undesirable. Specifically, during the manufacture of semiconductor integrated circuits, silicon wafers are generally introduced into a reactor chamber at atmospheric pressure and the reactor chamber is then degassed and the wafers are then treated with one or more reagents introduced into the reactor chamber which are used to modify the wafer.

In practice, turbulence can result in defects in the semiconductor integrated circuits. Specifically, particulate matter may collect within a reactor chamber by, for example, adhering to the walls of the reactor. Then, when turbulence is created within the reactor chamber, usually at the entrance to the evacuation line, particulate matter is caused to dislodge from the walls and can contaminate the wafers that are being processed. The wafer contamination can cause the semiconductor integrated circuits to be defective.

Workers in the art of fabricating semiconductor integrated circuits have attempted to control the turbulence that occurs in the reactor chamber as large volumes of fluid (e.g., air) in the reactor chamber are suddenly removed through the evacuation line. For instance, turbulence in evacuation chambers has been reduced by placing a valve in the evacuation line between the reactor chamber and a means for creating a partial vacuum includes a pump and a blower. The opening of the valve, shown in FIG. 1, is regulated such that, as evacuation begins, the valve is only slightly opened and flow is minimal. As the pressure drop across the valve decreases, the valve is slowly opened further, thus preventing large, turbulence-inducing flow rates. Also, a series of valves can be mounted in the evacuation line such that each set of two valves provides, in effect, a separate chamber. When it is desired to evacuate a reactor chamber, the opening of each valve can be set to produce a series of gradual pressure drops. However, in the case of the reactor chamber for semiconductor integrated circuits, the reactor chamber is typically at atmospheric pressure and a pump and blower causes a pressure drop to approximately 10 millitorrs. It has proven to be very difficult to control fluid flow in relatively large diameter evacuation lines, and these techniques for reducing turbulence during evacuation have produced largely unsatisfactory results. Turbulent effects have proven to be particularly in evidence when flow from the reactor chamber to the evacuation line is first being established.

In view of the shortcomings in prior art systems for controlling fluid flow in large diameter evacuation lines, workers in the art have attempted to reduce turbulence during evacuation of reactor chambers by connecting a second, smaller diameter line with a controllable valve between the reactor chamber and the portion of the main evacuation line near the means for creating a partial vacuum. Such solutions have, however, been found to be wanting in precision. Again, the large pressure drop that must occur between the opening to the slow pump line in the reactor chamber and the end of the slow pump line has been found to almost inevitably cause some turbulent effects in the reactor chamber. Further, it has been found that contaminants collect in the slow pump line itself and add to the contamination of the reactor chamber.

SUMMARY OF THE INVENTION

The present invention, generally speaking, provides a system and method of reducing turbulence during the evacuation of a reactor chamber. More particularly, the system minimizes the effects of turbulence in the reactor chamber upon initiating evacuation of the reactor chamber and, also, prevents contaminants that are collected in the evacuation apparatus from being inadvertently blown back into the reactor chamber. The system and method of this invention are particularly suited for evacuating a reactor chamber in a semiconductor product manufacturing process while minimizing particulate contamination of integrated circuit products in the reactor chambers.

In accordance with the present invention, turbulence in a reactor chamber during evacuation is controlled through the introduction, into an evacuation line, of a fluid under pressure for reducing the magnitude of a pressure drop over valves in the evacuation line that separates the reactor chamber and the means for creating a partial vacuum.

More specifically, a system for evacuating a reactor chamber lowers the differential pressure, in an evacuation line, of a fluid flowing from the reactor chamber by introducing another fluid into the evacuation line such that, as flow from the reactor chamber is being established, the pressure drop between the reactor chamber and the evacuation line is mitigated at least in part by the introduced fluid. In a preferred embodiment, the slow pump system includes a main evacuation line connecting a reactor chamber and means for creating a partial vacuum. A first valve means is mounted in the main evacuation line between the reactor chamber and the means for creating a partial vacuum, the valve thereby defining a chamber side and a vacuum side of the main evacuation line. A second line is connected to the main evacuation line on the vacuum side of the main evacuation line and is further connected to a means for supplying a fluid. In operation of the system, as the first valve means is opened and flow from the reactor chamber begins to be established, the means for supplying a fluid supplies a fluid to the main evacuation line so that the fluid from the reactor chamber will not be drawn out of the reactor chamber too rapidly due to the pressure drop across the first valve, and laminar flow from the reactor chamber can be gradually established. As the pressure differential between the reactor chamber and the means for creating a partial vacuum is decreased, the first valve may be opened further and the quantity of fluid supplied by the means for supplying a fluid may be decreased.

In a further embodiment of the present invention, a second valve means is provided in the main evacuation line on the vacuum side, the second valve means defining a first and a second portion of the vacuum side. A third end of the second line, one end of which is connected to the main evacuation line and another end of which is connected to a means for supplying a fluid, is connected to the second portion of the vacuum side.

In another embodiment of the present invention, a second valve means is provided in a main evacuation line on a vacuum side, the second valve means defining a first and a second portion of the vacuum side. A third line is provided that extends between the first and second portions of the vacuum side.

In yet another embodiment of the present invention, a fluid is supplied to the evacuation line as well as to the reactor chamber to purge the chamber of one fluid and replace it with another.

BRIEF DESCRIPTION OF THE DRAWINGS

The present invention can be further understood with reference to the following description in conjunction with the appended drawings, wherein like elements are provided with the same reference numerals. In the drawings:

FIG. 1 is a schematic diagram of a prior art reactor chamber evacuation system;

FIG. 2 is a schematic diagram of a prior art reactor chamber evacuation system with a slow pump line;

FIG. 3 is a schematic diagram of one embodiment of a slow pump system according to present invention;

FIG. 4 is a schematic diagram of a further embodiment of a slow pump system according to present invention;

FIG. 5 is a schematic diagram of a third embodiment of a slow pump system according to present invention;

FIG. 6 is a schematic diagram of a fourth embodiment of a slow pump system according to present invention; and FIG. 7 is a schematic diagram of an embodiment according to present invention in conjunction with a reactor chamber for the manufacture of semiconductor integrated circuits.

DETAILED DESCRIPTION OF THE INVENTION

In the system shown in FIG. 3, a main evacuation line 3 connects a reactor chamber 1 to a means for creating a partial vacuum 2. Typically, when evacuating a reactor chamber that is substantially at atmospheric or lower pressure, the means for creating a partial vacuum include a pump and blower system. However, particularly when evacuating a reactor chamber that is at a pressure that is greater than atmospheric pressure, the main evacuation line 3 may be vented to atmospheric or any desired pressure. A first valve 10 in the main evacuation line 3 defines a chamber side 31 and a vacuum side 32 of the main evacuation line 3. It has been found that, by locating the first valve 10 at a distance from the evacuation opening 1a in the reactor chamber 1, some of the impact in the reactor chamber of the pressure drop across the valve 10 can be reduced.

A fluid supply line 5 is connected to the vacuum side 32 of the main evacuation line. The other end of the fluid supply line is connected to a fluid supply source 8, which may include a compressor. Also, the fluid supply source can comprise a reservoir of fluid, such as compressed gas tanks, pipelines, and the like.

Further in the system, a second valve 11 defines a first portion 33 and a second portion 34 of the vacuum side 32 of the main evacuation line 3. The fluid supply line 5 connected to the vacuum side 32 of the main evacuation line 3 is connected to the first portion 33. The fluid supply line 5 includes a supply line valve means 12.

Control means 50 control the start-up of the means for creating a partial vacuum 2 and the fluid supply source, and for controlling the timing and extent of opening of valves 10, 11 and 12. The valves 10, 11 and 12 comprise one-way valves and step valves in conjunction with motor operated valves.

In the system in FIG. 4, the fluid supply line 5 is connected to a slow pump line 6 extending from a point on the fluid supply line to a point on the second portion 34 of the vacuum side 32 of the main evacuation line 3. In this embodiment, the slow pump line is mounted at a point in the fluid supply line 5 between the valve means 12 and the vacuum portion 32 of the main evacuation line 3. Further valves 13 can be mounted in the fluid supply line 5 between the slow pump line 6 and the vacuum portion 32 of the main evacuation line to provide additional fluid flow controls through the fluid supply line 5 near the point at which the slow pump line 6 joins the fluid supply line. The slow pump line 6 is connected to a slow pump valve means 13.

In the system in FIG. 5, a slow pump line 7 is connected between the first portion 33 and the second portion 34 of the vacuum side 32 of the main evacuation line 3. The fluid supply line 5 connects to the first portion 33 of the vacuum side 32 at a point closer to the first valve means 10 than the slow pump line 7. The slow pump line 7 is provided with slow pump line valve means 15.

In the system shown in FIG. 6, a slow pump line 18 is connected between the first portion 33 and the second portion 34 of the vacuum side 32 of the main evacuation line 3. The fluid supply line 5 connects to the first portion 33 of the vacuum side 32 at substantially the same point on the first portion 33 as the slow pump line 18, such as by means of a cross.

Operation of the slow pump system will now be described. When it is desired to evacuate the reactor chamber 1, a signal is sent to the means for creating a partial vacuum 2 instructing it to begin to create a partial vacuum in the second portion 34 of the main evacuation line 3. The means for creating a partial vacuum may, of course, be in a constant "on" state, even when the slow pump system is not in use, however, this results in a waste of energy. When the means for creating a partial vacuum 2 is turned on, the means for supplying a fluid 8 will also receive a signal to begin supplying a fluid and valve 12 in the fluid supply line will receive a signal to open to a predetermined extent. If, as in the above-described systems, the slow pump system is provided with a separate slow pump line, the valve means in the slow pump line will also receive a signal to open to a predetermined extent. If, instead, the slow pump system does not include a separate slow pump line, the second valve means 11 will receive a signal to open to a predetermined extent. In all of the above-described embodiments, the initiation of the evacuation process will begin by establishing some flow of supplied fluid from the fluid supply means 8 to the means for creating a partial vacuum 2.

When the flow of supplied fluid from fluid supply 8 to the means for creating a partial vacuum 2 has begun, the first valve means 10 will receive a signal to open a predetermined extent. The supplied fluid is initially prevented from entering the reactor chamber by the fact that the pressure within the reactor chamber is greater than the pressure of the supplied fluid. The provision of one-way flow valves at various points in the slow pump system further prevents improperly directed flow.

The opening of first valve 10 is, at first, such that the fluid flowing to the means for creating a partial vacuum 2 is made up of a mixture of fluid from the reactor chamber and supplied fluid. The flow rate of fluid from the reactor chamber 1 is controlled by the first valve 10 such that turbulence within the reactor chamber is minimal and the flow at the entrance to the main evacuation line 3 from the reactor chamber 1 tends to be laminar.

As the pressure within the reactor chamber 1 is reduced, the first valve means 10 is opened further, such that the fluid from the reactor chamber makes up a greater proportion of the fluid flowing to the means for creating a partial vacuum. The extent of the opening of the first valve means is controlled to prevent turbulence from developing within the reactor chamber 1. Also, the flow of supplied fluid can be stopped for creating a partial vacuum consisting primarily of fluid from the reactor chamber. When a desired vacuum is created within the reactor chamber 1, the valve means 10, 11 and 12 are closed, as well as valve means in the slow pump lines.

In the foregoing description of the operation of the slow pump system, reference was made to control signals for controlling the operation of the means for creating a partial vacuum, the fluid supply means, and the valve means. The slow pump system can also be operated manually or mechanically, such as by means of a cam system (not shown). Because of the relative simplicity of the operations and controls for an electrical system, however, such a system is preferred.

As shown in FIG. 7, a slow pump system operates in conjunction with a reactor chamber and related apparatus for the manufacture of semiconductor integrated circuits. In this system, the fluid supply source 8 serves the multiple purposes of supplying a fluid through the fluid supply line 5 to the slow pump system, as well as supplying the same fluid, usually nitrogen, to the reactor chamber 1 to bring the reactor chamber to atmospheric pressure after processing of semiconductor integrated circuits with process gases within the reactor chamber and then purging the chamber of gases to eliminate reagents from the system. The general operation of such a system is as follows. After semiconductor integrated circuits are introduced into the reactor chamber 10 the reactor chamber is pumped to a low pressure through the operation of the above-described slow pump system. Process gases such as $Cl_2$, $NF_3$ or $CHF_3$ are introduced to the reactor chamber from a gas box 50 through an auxiliary gas box 51. The wafers in the reactor chamber are then etched by the process gases. The process gases are then turned off. The fluid supply means 8 then supplies fluid (e.g., nitrogen) through a line 9 to bring the reactor chamber to atmospheric pressure. The fluid supply line may be connected to the same line as the line that feeds the process gases to the reactor chamber or may be fed directly into the reactor chamber. The reactor chamber is then pumped down to a low pressure again, through use of the slow pump system. During chamber pumping, it may be desirable to bleed a small quantity of fluid through line 9 into reactor chamber 1 to facilitate purging of reactor chamber 1 and to minimize the possibility that the pressure in reactor chamber 1 will be less than that of evacuation line 3 resulting in fluid backwashing from evacuation line 3 into reactor chamber 1.

The foregoing has described the principles, preferred embodiments and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of present invention as defined by the following claims.

What is claimed is:

1. A system for evacuating a reactor chamber comprising:
   a first line having first and second ends which is connected at its first end to the reactor chamber which contains a first fluid;
   means for creating a partial vacuum connected at the second end of the first line;
   first valve means located in the first line between the reactor chamber and the vacuum means which defines a chamber side of the first line and a vacuum side of the first line for opening and closing the first line and for preventing fluid from flowing from said vacuum side to said chamber side;
   means for supplying a gradually decreasing amount of a second fluid to the vacuum side of the first line whereupon the first fluid mixes with the second fluid when the first valve means is opened and for controlling the flowrate of the first fluid from the reactor chamber such that turbulence within the reactor chamber is minimal, wherein said means for supplying a second fluid comprises a second line connected at one end thereof to the first line and at another end thereof to a second fluid supply source and wherein said means for creating partial vacuum produces a pressure on the vacuum side that is effective to evacuate the first fluid, the second fluid, or mixtures thereof.

2. A system for evacuating a reactor chamber as in claim 1, wherein the second line is connected to the vacuum side of the first line at a point more proximate to the first valve means as opposed to the means for creating a partial vacuum.

3. A system for evacuating a reactor chamber as in claim 1, which further comprises a second valve means located in the vacuum side of the first line for opening and closing the first line wherein the second valve means define a first part of the vacuum side located between the first valve means and the second valve means and a second part of the vacuum side located between the second valve and the vacuum means and wherein the second line is connected to the first part of the vacuum side.

4. A system for evacuating a reactor chamber as in claim 3, wherein the second line is connected to the first part of the vacuum line at a point more proximate to the first valve means as opposed to the second valve means.

5. A system for evacuating a reactor chamber as in claim 1, wherein the means for supplying a second fluid comprises a pump.

6. A system for evacuating a reactor chamber as in claim 1, wherein the means for supplying a second fluid comprises a source of compressed fluid.

7. A system for evacuating a reactor chamber as in claim 1, wherein the means for supplying a second fluid supplies nitrogen.

8. A system for evacuating a reactor chamber as in claim 1, wherein a pressure on the chamber side is greater than or equal to a pressure on the vacuum side.

9. A system for evacuating a reactor chamber as in claim 3, further comprising remote means for controlling opening of the second valve means.

10. A system for evacuating a reactor chamber as in claim 1, further comprising remote means for controlling the start-up of the means for creating a partial vacuum.

11. A system for evacuating a reactor chamber as in claim 1, further comprising remote means for controlling the supply of second fluid from the means for supplying a second fluid.

12. A system for evacuating a reactor chamber as in claim 1, further comprising remote means for simultaneously controlling: (1) opening of the first valve means, (2) the start-up of the means for creating a partial vacuum and (3) the supply of second fluid from the means for supplying a second fluid.

13. A system for evacuating a reactor chamber as in claim 1, further comprising a third line having first and second ends wherein the first end is connected to the reactor chamber and the second end is connected to a means for supplying a fluid to the reactor chamber.

14. A system for evacuating a reactor chamber as in claim 1, wherein the first fluid comprises a process gas selected from the group consisting of $Cl_2$, $NF_3$ and $CHF_3$, or mixtures thereof.

15. A method for evacuating a reactor chamber maintained at a first pressure and connected to a means for creating a partial vacuum through a first line having first and second ends wherein the first end is connected to the reactor chamber and the second end is connected to the vacuum means, further wherein the first line contains a first valve means located between the reactor chamber and the vacuum means for opening and closing the first line wherein the first valve means define a chamber side of the first line and a vacuum side of the first line and still further wherein the first line contains a means for supplying a fluid to the vacuum side of the first line at a point more proximate to the first valve means than to the vacuum means, the method comprises the steps of:

creating a second pressure in a vacuum side of the first line, the second pressure being less than the first pressure;

supplying a fluid to the vacuum side through the means for supplying a fluid, such that a pressure gradient is created in the vacuum side with a higher pressure being located proximate the first valve means and a lower pressure being located proximate the vacuum means;

controlling the rate at which the first valve means is opened and the rate of fluid supply such that, as the first valve means is opened, fluid is supplied at a rate to maintain a pressure near the first valve means that permits flow in the direction of the means for creating a vacuum and prevents flow in the direction of the reactor chamber, the opening rate and the supply rate being controlled to attain a desired reduction in the turbulence created in the reactor chamber.

16. A method for evacuating a reactor chamber as in claim 15, wherein the reactor chamber contains a first fluid and wherein the step of supplying a fluid to the vacuum side comprises of supplying a second fluid to the vacuum side whereupon the first fluid mixes with the second fluid when the first valve means is opened.

17. A method for evacuating a reactor chamber as in claim 16 wherein the first fluid comprises a process gas selected from the group consisting of $Cl_2$, $NF_3$ and $CHF_3$, or mixtures thereof.

* * * * *